(12) United States Patent
Bailey, III et al.

(10) Patent No.: US 7,129,167 B1
(45) Date of Patent: Oct. 31, 2006

(54) METHODS AND SYSTEMS FOR A STRESS-FREE CLEANING A SURFACE OF A SUBSTRATE

(75) Inventors: Andrew D. Bailey, III, Pleasanton, CA (US); Shrikant P. Lohokare, Fremont, CA (US); Yunsang Kim, San Jose, CA (US); Simon McClatchie, Fremont, CA (US)

(73) Assignee: LAM Research Corporation, Fremont, CA (US)

( * ) Notice: Subject to any disclaimer, the term of this patent is extended or adjusted under 35 U.S.C. 154(b) by 0 days.

(21) Appl. No.: 10/879,598

(22) Filed: Jun. 28, 2004

Related U.S. Application Data

(63) Continuation-in-part of application No. 10/769,498, filed on Jan. 30, 2004, now Pat. No. 7,078,344, and a continuation-in-part of application No. 10/769,522, filed on Jan. 30, 2004, and a continuation-in-part of application No. 10/390,520, filed on Mar. 14, 2003, now Pat. No. 6,821,899, and a continuation-in-part of application No. 10/390,117, filed on Mar. 14, 2003, now Pat. No. 6,939,796.

(51) Int. Cl.
*H01L 21/44* (2006.01)

(52) U.S. Cl. ............... 438/677; 438/692; 438/694; 438/758; 438/E21.228; 134/1.3; 134/2

(58) Field of Classification Search ............... None
See application file for complete search history.

(56) References Cited

U.S. PATENT DOCUMENTS 5,098,516 A    3/1992  Norman et al.

2003/0032292 A1*  2/2003  Noguchi ............... 438/692
2004/0023606 A1*  2/2004  Wang et al. ........... 451/296
2004/0188713 A1*  9/2004  Rantala et al. ........ 257/200
2004/0206454 A1* 10/2004  Chopra et al. ....... 156/345.12
2005/0026442 A1*  2/2005  Li et al. ............... 438/692
2005/0032381 A1*  2/2005  Moon et al. .......... 438/691

OTHER PUBLICATIONS

Nagraj S. Kulkarni, Robert T. DeHoff, "Application of Volatility Diagrams for Low Temperature, Dry Etching, and Planarization of Copper", *Journal of the Electromechanical Society*, 149, 2002, pp. G620-G632.

Y. Ohshita, N. Howi, "Lower Temperature Plasma Etching of Cu Using IR Light Irradiation", *Thin Solid Films*, 262, 1995.

Lynn R. Allen, John M. Grant, "Tungsten Plug Etchback And Substrate Damage Measured By Atomic Force Microscopy", *J. Vac. Sci Technol.* B 13(3), May/Jun. 1995, pp. 918-922.

(Continued)

*Primary Examiner*—Dung A. Le
(74) *Attorney, Agent, or Firm*—Martine Penilla & Gencarella, LLP

(57) ABSTRACT

A method of cleaning a substrate includes receiving a substrate and applying a stress-free cleaning process to the top surface of the substrate. The substrate includes a top surface that is substantially free of device dependent planarity nonuniformities and device independent planarity nonuniformities. The top surface also includes a first material and a device structure formed in the first material, the device structure being formed from a second material. The device structure has a device surface exposed. The device surface has a first surface roughness. A system for stress-free cleaning a substrate is also described.

16 Claims, 15 Drawing Sheets

OTHER PUBLICATIONS

Seongju Park, T.N. Rhodin, L.C. Rathbun, "Halide Formation And Etching Of Cu Thin Films with $Cl_2$ and $Br_2$", *J. Vac. Sci. Technol.* A (2), Mar./Apr. 1986, pp. 168-172.

J. Farkas, K.-M. Chi, M.J. Hampden-Smith, T.T. Kodas, "Low Temperature Copper Etching Via Reactions With $Cl_2$ and $PEt_3$ Under Ultrahigh Vacuum Conditions", *J. Appl. Phys.* 73 (3), Feb. 1, 1993, pp. 1455-1460.

William F. Marx, Yunju Ra, Richard Yang, Ching-Hwa Chen, "Plasma And Processing Effects of Electrode Spacing For Tungsten Etchback Using A Bipolar Electrostatic Wafer Clamp", *J. Vac. Sci. Technol.* A12(6), Nov./Dec. 1994, pp. 3087-3090.

Lynn R. Allen, "Tungsten Plug Etchback In A TCP Etcher", pp. 255-263.

N. Hosoi, Y Ohshita, "Plasma Etching Of Copper Films Using IR Light Irradiation", *Mat. Res. Soc. Symp. Proc.* vol. 337, 1994, pp. 201-205.

\* cited by examiner

METHODS AND SYSTEMS FOR A STRESS-FREE CLEANING A SURFACE OF A SUBSTRATE

CROSS REFERENCE TO RELATED APPLICATIONS

This application is a continuation-in-part of and claims priority of U.S. patent application Ser. No. 10/390,117 filed on Mar. 14, 2003 U.S. Pat. No. 5,939,796 and entitled "System, Method and Apparatus For Improved Global Dual-Damascene Planarization," which is incorporated herein by reference in its entirety. This application is also a continuation-in-part of and claims priority from U.S. patent application Ser. No. 10/390,520 filed on Mar. 14, 2003 U.S. Pat. No. 6,821,899 and entitled "System, Method and Apparatus For Improved Local Dual-Damascene Planarization," which is incorporated herein by reference in its entirety. This application is also a continuation-in-part of and claims priority from U.S. patent application Ser. No. 10/769,498, filed on Jan. 30, 2004 U.S. Pat. No. 7,078,344 and entitled "Stress Free Etch Processing in Combination with a Dynamic Liquid Meniscus," which is incorporated herein by reference in its entirety. This application is also a continuation-in-part of and claims priority from U.S. patent application Ser. No. 10/769,522, filed on Jan. 30, 2004 and entitled "System and Method for Stress Free Conductor Removal," which is incorporated herein by reference in its entirety.

BACKGROUND OF THE INVENTION

1. Field of the Invention

The present invention relates generally to dual damascene semiconductor manufacturing processes, and more particularly, to methods and systems for planarizing features and layers in a semiconductor manufacturing process.

2. Description of the Related Art

Dual damascene manufacturing processes are becoming more common in semiconductor manufacturing. In a typical dual damascene manufacturing process, one or more conductive materials are deposited in previously patterned trenches and vias formed in a semiconductor substrate or films formed on the semiconductor substrate to form the desired electrical circuit interconnects. An excess or overburden portion of the conductive material is often formed. The overburden portion of the conductive material is unnecessary and undesirable and must be removed both to produce a damascene feature and to provide a planar surface for subsequent processing. Often, the overburden portion is formed unevenly having low areas and raised areas that correspond to the patterned trenches and vias formed in the underlying layer.

The overburden portion of the conductive material is typically removed from the semiconductor substrate through chemical mechanical polishing (CMP) and electro-chemical polishing (ECP) (e.g., etching) processes and combinations of CMP and ECP processes. Each of these processes has significant shortfalls. By way of example, ECP typically has a relatively low throughput, poor uniformity and inability to effectively remove non-conductive material.

CMP is a physical contact process which typically leaves conductive residues, or causes corrosion of the various materials, or result in non-uniform removal, and the inability to suitably planarize interconnect and interlevel dielectric (ILD) top surface. CMP can also cause stress related damage (e.g., interlayer delamination, peeling) to remaining interconnect and ILD structures. The CMP-caused stress damage is further exacerbated by the very poor inter-layer adhesion characteristics of the more-recently used materials (e.g., low-k dielectric materials). Reducing the physical force of the CMP process to reduce the physical stress can often result in unacceptably low throughput rates and other poor process performance parameters.

FIG. 1A shows a typical semiconductor substrate 100. A typical CMP process has been applied to the semiconductor substrate 100 to substantially remove an overburden layer and to expose an underlying layer 104. Layer 104 includes features (e.g., vias, trenches, etc.) that were formed in a previous manufacturing process. A portion of the overburden layer remains in the form of a non-uniformity 102 on the surface of the semiconductor substrate 100. The non-uniformity 102 has a thickness of greater than about 500 angstroms in a thickest portion. Multiple elevations 102A–102E of the non-uniformity 102 are illustrated. By way of example, the region encompassed by elevation 102A can represent where the non-uniformity 102 has a thickness of about less than 100 angstroms. Similarly, the region encompassed by elevation 102B can represent where the non-uniformity 102 has a thickness of between about 100 and about 200 angstroms. The region encompassed by elevation 102C can represent where the non-uniformity 102 has a thickness of between about 200 and about 300 angstroms. The region encompassed by elevation 102D can represent where the non-uniformity 102 has a thickness of between about 300 and about 400 angstroms. The region encompassed by elevation 102E can represent where the non-uniformity 102 has a thickness of between about 400 and about 500 angstroms. The region encompassed by elevation 102F can represent where the non-uniformity 102 has a thickness of greater than about 500 angstroms.

The typical CMP process includes applying a moving a polishing pad to the surface of the semiconductor substrate 100. Friction is generated between the polishing pad and the materials in surface of the semiconductor substrate 100. The friction removes a portion of the materials in the surface of the semiconductor substrate 100. Each material on the surface of the semiconductor substrate 100 has a different coefficient of friction with the polishing pad. By way of example, the surface of the semiconductor substrate 100 can include oxide (e.g., silicon oxide) and copper materials. The oxide has a first coefficient of friction with the polishing pad and the copper has a second coefficient of friction with the polishing pad. The first coefficient of friction is typically different (i.e., higher or lower) than the second coefficient of friction.

Where a difference in the first and second coefficients of friction occur, stresses can be imparted into the semiconductor substrate 100. At a point or area where the two different coefficients of friction meet, the stresses can be substantially concentrated. By way of example, as a typical CMP process polishes through a copper layer to expose an underlying oxide layer, the stresses become concentrated at the areas where the differences in coefficients of friction occur (i.e., where the copper layer and the oxide layers meet).

Referring again to FIG. 1A above, as the polishing pad polishes across a first material (i.e., the exposed underlying layer 104) to a second material (i.e., the non-uniformity 102) the coefficient of friction varies. As a result, the polishing process can concentrate considerable stresses into the semiconductor substrate 100 where the non-uniformity is thinnest (e.g., region 102A). Region 102A can have relatively large areas. As a result, the stresses can be imparted to a relatively large portion of the semiconductor substrate 100. These stresses can be substantially parallel (i.e., horizontal) stress vectors that are substantially parallel with the surface of the substrate 100. These stresses can also be substantially vertical stress vectors that are substantially perpendicular with the surface of the semiconductor substrate 100.

FIG. 1B shows a detailed, cross-sectional view of the semiconductor substrate 100. As shown in FIG. 1A, the non-uniformity 102 becomes relatively thin (e.g., toward the outer edges) such as in region 102A, the non-uniformity becomes increasing susceptible to damage caused by the vertical and horizontal stresses. By way of example, if the polishing pad is moving in the direction 120 relative to the surface of the substrate, then the thin, edge region 102A of the non-uniformity 102 can be peeled away from the underlying layer 104 by the horizontal stresses caused by the difference in a first coefficient of friction between the underlying layer 104 and the polishing pad and a second coefficient of friction between the non-uniformity 102 and the polishing pad. As the non-uniformity 102 is pulled away from the underlying layer 104, a feature 112 that is attached to the non-uniformity 102 can be pulled or stressed in a vertical direction. By way of example, the feature 112 can be a via that is filled with a conductive material (e.g., copper, aluminum, etc) to provide a contact to a device 114 in an underlying layer 116. As the conductive material is pulled vertically from the via 112, the contact area with the device 114 is substantially reduced.

FIG. 1C shows yet another example of damage 132 that can be caused by typical CMP processes. Due to the difference between the first coefficient of friction (e.g., between the layer 104 and the polishing pad) and a third coefficient of friction between the conductive material in the via 112, the layer 104 can be pulled away from the conductive material in the via 112. FIG. 1D shows another detailed view of the damage 132 that can be caused by typical CMP processes. As shown in FIG. 1D, the conductive material in the via 112 is slightly dished, relative to the layer 104. As a result, an edge 134 of the layer 104 is exposed. The edge 134 can further concentrate the stresses on the edge so as to cause the edge of the layer 104 to be pulled away from the conductive material in the via 112.

As a result of the layer 104 being pulled away from the conductive material in the via 112, a void 132 is formed between the conductive material in the via 112 and the layer 104. The void 132 can cause countless problems (e.g., corrosion, misalignment, etc.) in the subsequent manufacturing processes. The void 132 can also substantially reduce the reliability of the contact to the device 114. As shown in FIGS. 1A–C above, the stresses imparted to the top layers 102 and 104 by the typical CMP processes can damage features 112, 114 one or more layers below.

In view of the foregoing, there is a need for an improved planarizing system and method to uniformly and substantially remove overburden material while minimizing physical stresses to the remaining features. The improved planarizing system and method should be suitable for use in semiconductor manufacturing and should be applicable to processes such as a dual damascene process or other semiconductor manufacturing processes.

SUMMARY OF THE INVENTION

Broadly speaking, the present invention fills these needs by providing an improved substrate cleaning system and method. It should be appreciated that the present invention can be implemented in numerous ways, including as a process, an apparatus, a system, computer readable media, or a device. Several inventive embodiments of the present invention are described below.

One embodiment provides a method of cleaning a substrate. The method includes receiving a substrate and applying a cleaning process to the top surface of the substrate. The substrate includes a top surface that is substantially free of device dependent planarity nonuniformities and device independent planarity nonuniformities. The top surface also includes a first material and a device structure formed in the first material, the device structure being formed from a second material. The device structure has a device surface exposed. The device surface has a first surface roughness.

The device structure can be formed in a damascene process. The top surface being substantially free of device dependent planarity nonuniformities and device independent planarity nonuniformities can include the top surface being substantially locally planar and substantially globally planar.

The cleaning process substantially reduces the first surface roughness to less than about 20 angstrom. The cleaning process can include a dynamic liquid meniscus process. The cleaning process can include a low down force CMP process. The low down force CMP process can include applying less than about 1 psi down force. The cleaning process can include an endpoint etch process. The cleaning process can include applying a brush to the surface of the substrate. The cleaning process can further include applying a wet etch chemistry to the surface of the substrate. The cleaning process can further include applying a cleaning process using a dynamic liquid meniscus.

The cleaning process imparts a minimal shearing force. The cleaning process can be selective to the first material. Alternatively, the cleaning process can be selective to the second material.

Another embodiment provides a method for processing a substrate. The method includes receiving a substrate, planarizing a top surface of the substrate and applying a cleaning process to the top surface of the substrate. Planarizing the top surface of the substrate includes planarizing to substantially eliminate any device dependent planarity nonuniformities and any device independent planarity nonuniformities. The top surface includes a first material and a device structure formed in the first material, the device structure being formed from a second material. The device structure has a device surface exposed. The device surface has a first surface roughness.

Planarizing the substrate to substantially eliminate any device dependent planarity nonuniformities and any device independent planarity nonuniformities can include applying a substantially stress-free etch planarization process. Planarizing the substrate to substantially eliminate any device dependent planarity nonuniformities and any device independent planarity nonuniformities can include a planarizing process that does not impart stresses to the substrate that would cause stress-related failures in a device or structure formed in the substrate.

Yet another embodiment provides a system for processing a substrate. The system includes a planarization process tool and a stress free cleaning process tool. The stress free cleaning process can include a dynamic liquid meniscus process, a cleaning brush process, a low down force CMP process or combinations thereof. The cleaning process can further include applying a wet etch chemistry to the surface of the substrate. The cleaning process can further include applying a cleaning process using a dynamic liquid meniscus. The stress free cleaning process imparts a minimal shearing force.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for an improved substrate cleaning system and method will now be described. It will be apparent to those skilled in the art that the present invention may be practiced without some or all of the specific details set forth herein. One embodiment of an improved cleaning system and method provides improved cleaning and/or buffing to a substrate that is substantially free of device dependant and device independent nonuniformities. The improved cleaning system and method can substantially reduce surface roughness. The improved cleaning system and method can also remove undesirable residues from the surface of the substrate.

Part I: Stress Free Planarization

Figure 1A:
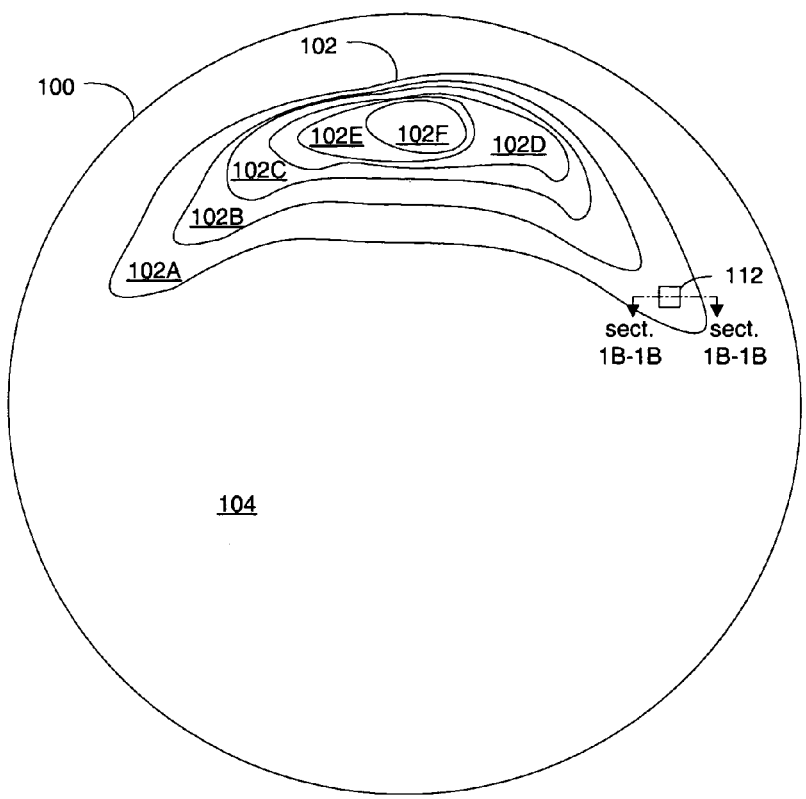
FIG. 1A shows a typical semiconductor substrate.
Figure 1B:
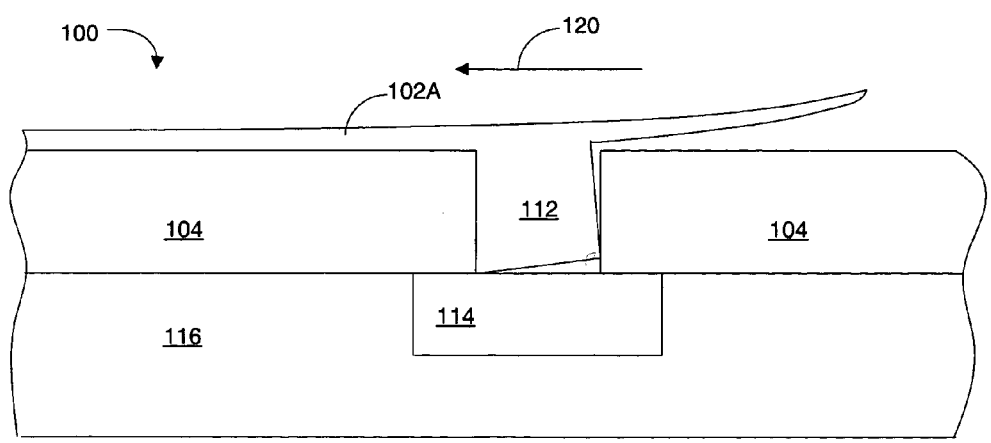
FIG. 1B shows a detailed, cross-sectional view of the semiconductor substrate.
Figure 1C:
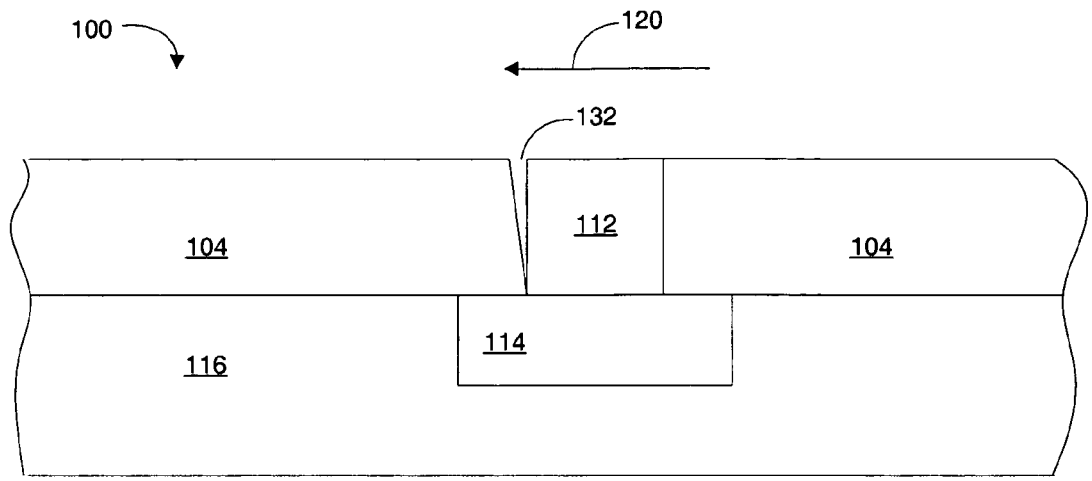
FIG. 1C shows yet another example of damage that can be caused by typical CMP processes.
Figure 1D:
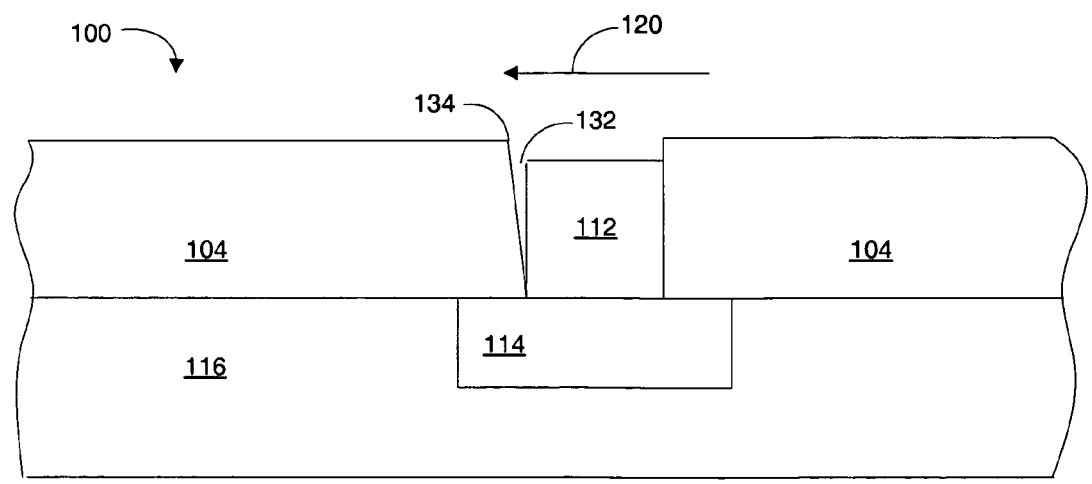
FIG. 1D shows another detailed view of the damage that can be caused by typical CMP processes.
Figure 2A:
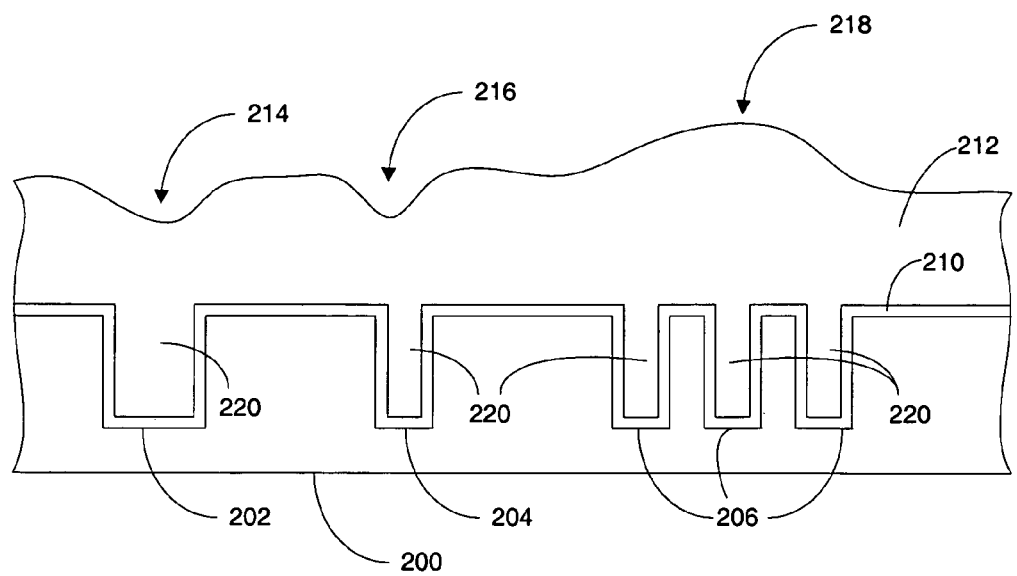
FIG. 2A shows a patterned semiconductor substrate in accordance with one embodiment of the present invention.

FIG. 2A shows a patterned semiconductor substrate 200 in a dual damascene process in accordance with one embodiment of the present invention. The substrate 200 has been patterned as part of the semiconductor manufacturing process such as a dual damascene manufacturing process. A mask can be used to pattern the substrate 200. The substrate 200 includes a large, somewhat isolated feature 202 (e.g., trench, via, etc.) a smaller, somewhat isolated feature 204 and several features 206 that are densely packed together. A barrier layer 210 is also included. The barrier layer 210 is typically a different material than the substrate 200 or a conductive interconnect material 120. The conductive interconnect material 120 can be copper or copper alloy or other conductive material.

An overburden portion 212 of the conductive interconnect material 120 extends above the features 202, 204, 206 and includes corresponding localized variations 214, 216, 218 in thickness of the overburden portion 212. As shown, the larger feature 202 has a corresponding larger decrease in the thickness of the overburden portion 212 as compared to the smaller feature 204, which has a slightly smaller variation in thickness of the overburden portion 212. The densely packed features 206 have a somewhat increased thickness of the overburden portion 212.

Typical etch processes etch the overburden portion 212 of the conductive interconnect material 120 at a fairly uniform rate over the entire wafer area and therefore the typical etching process will expose the barrier layer 210 near the large feature 202 before the barrier layer 210 near the densely packed features 206 will be exposed. In sum, the typical etching process cannot planarize the overburden portion 212 of the conductive interconnect material.

Figure 2B:
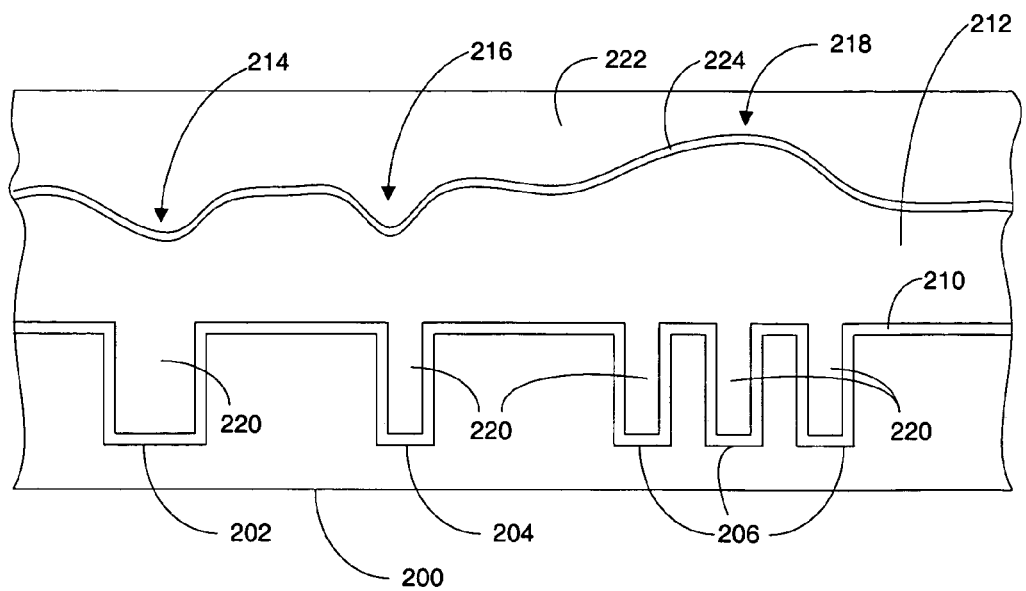
FIG. 2B shows an additional layer added in accordance with one embodiment of the present invention.

FIG. 2B shows an additional layer 222 added in accordance with one embodiment of the present invention. The additional layer 222 is formed on top of the overburden portion 212. The additional layer 222 can be a substantially planar fill material (e.g., spin on glass (SOG), polysilicon, polymer resist, bilayer, UV or thermally curable material, or other material that can flow to form a planar surface and which has the appropriate etching characteristics). An optional, relatively thin (e.g., about 25–100 nm in thickness) conformal layer 224 may also be included between the additional layer 222 and the overburden portion 212. The conformal layer 224 can be a barrier layer or an adhesion layer. The conformal layer 224 can allow a wider variety of materials that can be used for the additional layer 222.

The additional layer 222 and the overburden portion 212 have a substantially 1:1 etch selectivity so that a subsequent etching process (e.g., plasma or gaseous etch process) can etch both the additional layer 222 and the overburden portion 212 at substantially the same rate.

Figure 3:
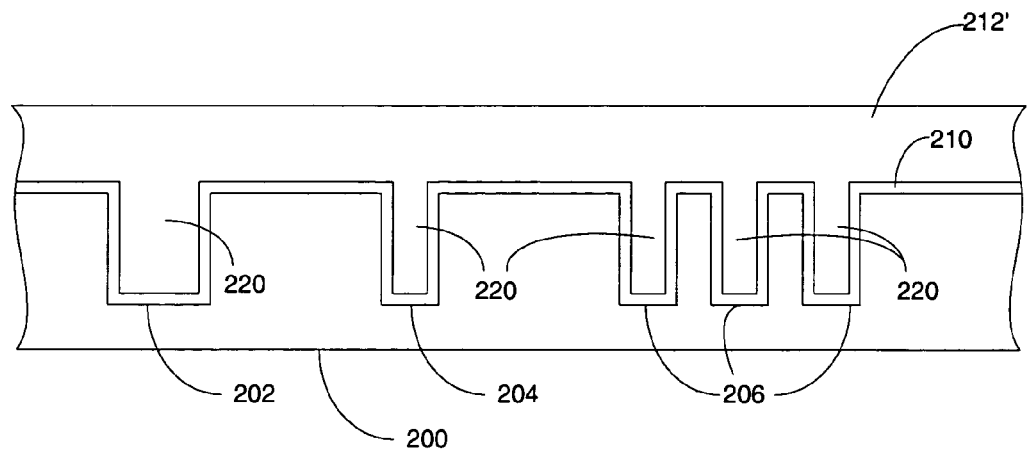
FIG. 3 shows a substantially planar overburden portion in accordance with one embodiment of the present invention.

FIG. 3 shows a substantially planar overburden portion 212' in accordance with one embodiment of the present invention. Because the additional layer 222 forms a substantially planar surface over the stack of layers 200, 210, 212, 222, a first etching process can uniformly etch the additional layer 222 and the overburden 212 over the entire area until the remaining overburden portion 212' is substantially locally planar in that the local variations 214, 216, 218 are substantially eliminated.

A typical recipe would involve conditions that provide a 1:1 etch selectivity between the additional layer 222 and the overburden portion 212. By way of example, if the additional layer 222 is SOG, and the overburden portion 212 is copper, then a halogen (e.g., Cl, F, Br, I) based chemistry provides etch rate control for both the SOG as well as copper to allow for tuning for the desired 1:1 selectivity. Although any plasma feed gas producing reactive halogen radicals can be used, CF4, Cl2, and HCl are typical examples. Various process parameters can be adjusted to control etch rates, selectivity, uniformity and reduce corrosion include variation of process variables such as substrate temperature and inclusion of one or more additives (e.g., Ar, H2, Cl, O2, CH3X (X=F, Cl, Br, I), CH2F2, and CH4).

Another approach involves a sputter dominant etch with Ar or other inert gas such as He, Xe, Ne, Kr, as the primary etchant of the copper overburden portion 212 with other additives to provide etch rate control of the additional layer 222 and passivation of the top surface of the remaining copper 212. The other additives can include, for example H2 and/or CF4. Either of these processes is can operate over a wide temperature range of between about 75 degrees C. and about 400 degrees C.

The first etching process is an etch process designed to leave the remaining overburden portion 212' substantially locally planar in that the local variations 214, 216, 218 are substantially eliminated. One or more subsequent etching processes will remove the bulk or the majority of the overburden portion 212'. A finish etching process can be applied to continue the etching process to an endpoint at which the overburden portion 212' is removed from the barrier 210. The finish etching process can also be included in the bulk etch process. Subsequent processes after the finish etch can include selective barrier removal and passivating the remaining conductive material 120 to prevent corrosion and provide stability for further processing. An additional operation after the finish etch can be designed not to significantly remove any material but only passivate the remaining conductive material 120 to prevent corrosion and provide stability for further processing.

Figure 4A:
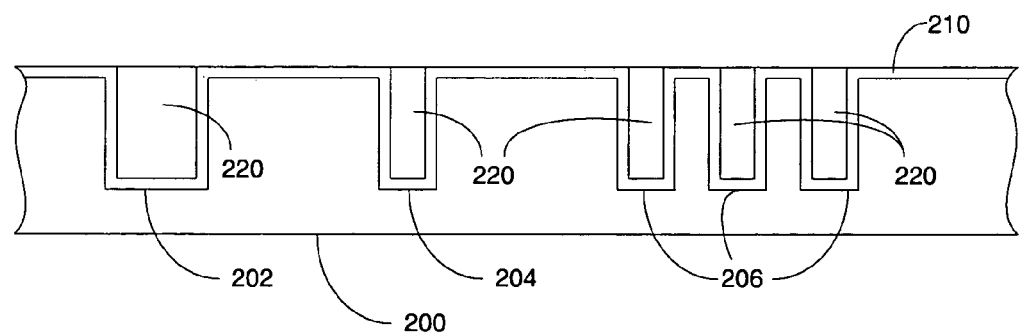
FIG. 4A shows the substrate having undergone a second etching process in accordance with one embodiment of the present invention.

FIG. 4A shows the substrate 200 having undergone a second etching process in accordance with one embodiment of the present invention. The second etching process continues to an endpoint such that the barrier layer 210 will be exposed at all locations substantially simultaneously and leaving only the portion 120 of the conductive material (e.g., copper, copper-containing alloys and combinations, and other conductive material) that fills the features 202, 204, 206.

The first etching process and the second etching process can be substantially similar or significantly different. By way of example, the first etching process can be an etching process for improving the local planarity of the overburden portion 212 due to local non-uniformities 214, 216, 218 (e.g., caused by feature 202, 204, 206 locations, sizes and concentrations in underlying layers). The entire additional layer 222 and a portion of the overburden portion 212 can be removed in the first etching process. By comparison, the second etching process can be a much more selective etching process that removes the bulk of the remaining, planar overburden 212' to the endpoint (i.e., when the barrier layer 210 is exposed).

Figure 4B:
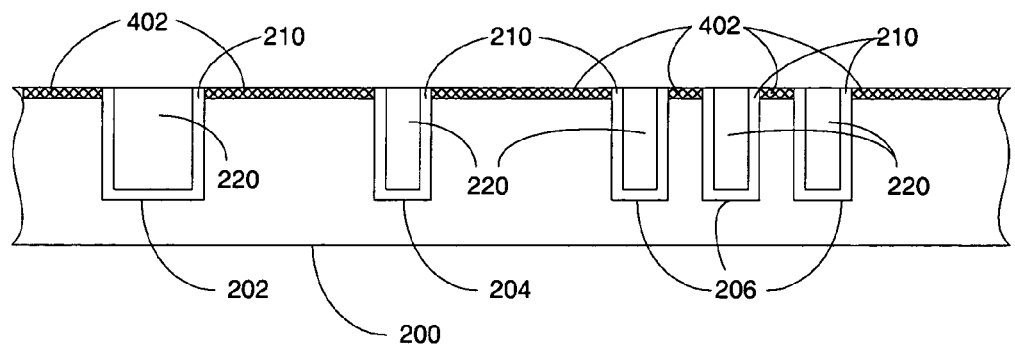
FIG. 4B shows the substrate having undergone a barrier removal process in accordance with one embodiment of the present invention.

FIG. 4B shows the substrate having undergone a barrier removal process in accordance with one embodiment of the present invention. A portion of the barrier layer 210 is removed to expose an underlying mask layer 402. Only the portion of the barrier layer 210 that is formed within the features 202, 204, 206 remain. A typical second etching process removes the bulk portion of the overburden 212 at high rate and preferably with a high selectivity to the barrier layer 210. By way of example, if the overburden portion 212 is copper, a halogen-based chemistry (e.g., Cl2, CF4, HCl, HBr, BCl3) can be effectively used for the second etching process. In another approach a physically dominant etch process such as an Ar (or other noble or inert gas) based sputter process can be used. Various process parameters can be adjusted to control etch rates and selectivity. The various process parameters can include adjusting process variables such as substrate temperature balance of reactive species, and inclusion of one or more additives (e.g., H2, O2, Ar, He, Xe, Ne, Kr, etc.).

Figure 5:
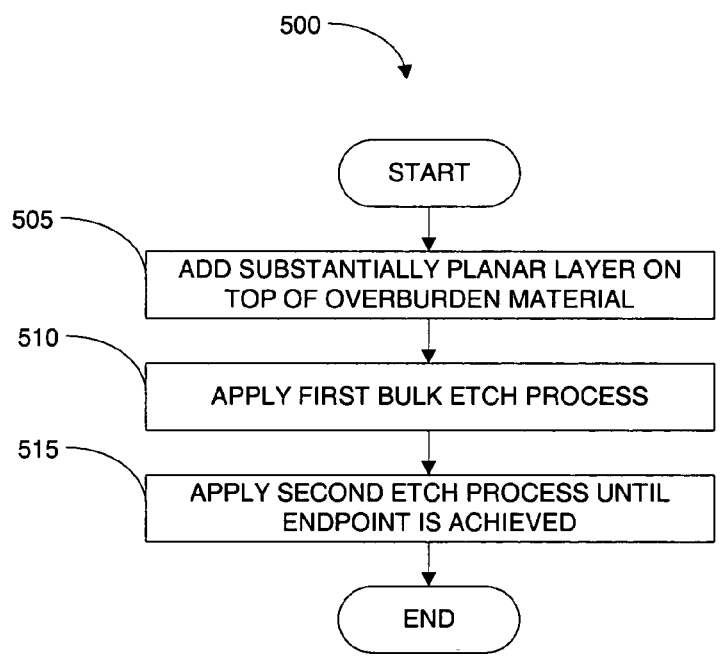
FIG. 5 is a flowchart of the method operations of performing a local planarization, in accordance with one embodiment of the present invention.

FIG. 5 is a flowchart 500 of the method operations of performing a local planarization, in accordance with one embodiment of the present invention. In operation 505, the additional layer 222 is added on top of the conductive overburden portion 212. In operation 510, the first etch process is applied to remove the majority of the additional layer 222 and the conductive overburden portion 212. In operation 515, the second etch process is applied to remove the remaining overburden portion 212' to the endpoint.

In an alternative embodiment, operation 515 can also include a finish etch process as described above. Subsequent processes after the finish etch can include selective barrier removal and passivating the remaining conductive material 120 to prevent corrosion and provide stability for further processing. An additional operation after the finish etch process can be designed not to significantly remove any material but only passivate the remaining conductive material 120 to prevent corrosion and provide stability for further processing.

Figure 6A:
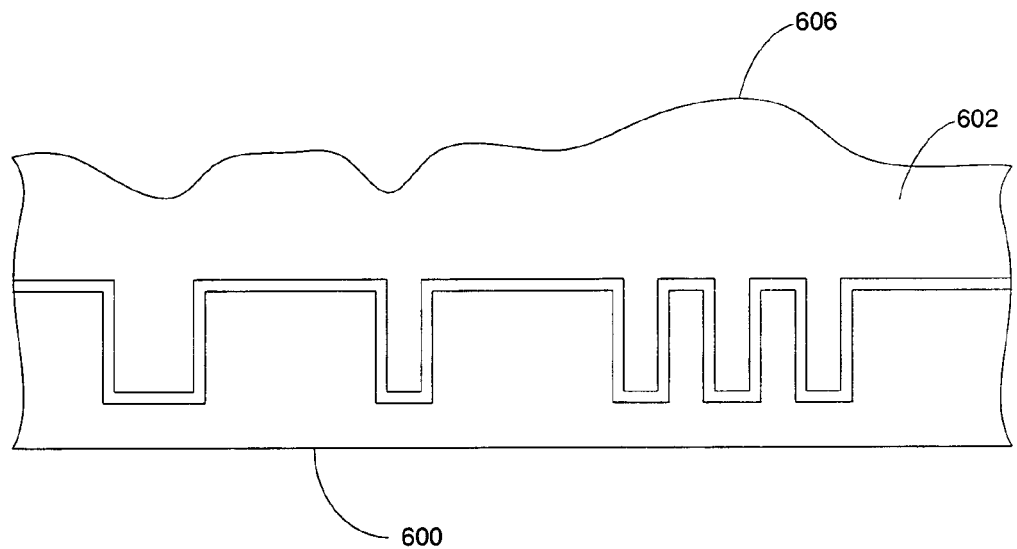
FIGS. 6A–6D show a sequence of chemical conversion and etch-back processes applied to a substrate to increase local uniformity, in accordance with one embodiment of the present invention.

FIGS. 6A–6D show a sequence of chemical conversion and etch-back processes applied to a substrate 600 to increase local uniformity, in accordance with one embodiment of the present invention. FIG. 7 is a flowchart 700 of the method operations of the chemical conversion and etch-back processes applied to a substrate 600 to increase local uniformity, in accordance with one embodiment of the present invention. As shown in FIG. 6A, the substrate 600 has a substantially non-planar overburden portion 602 with non-planar surface profile 606, similar to the substrate 200 described in FIG. 2A above.

Figure 6B:
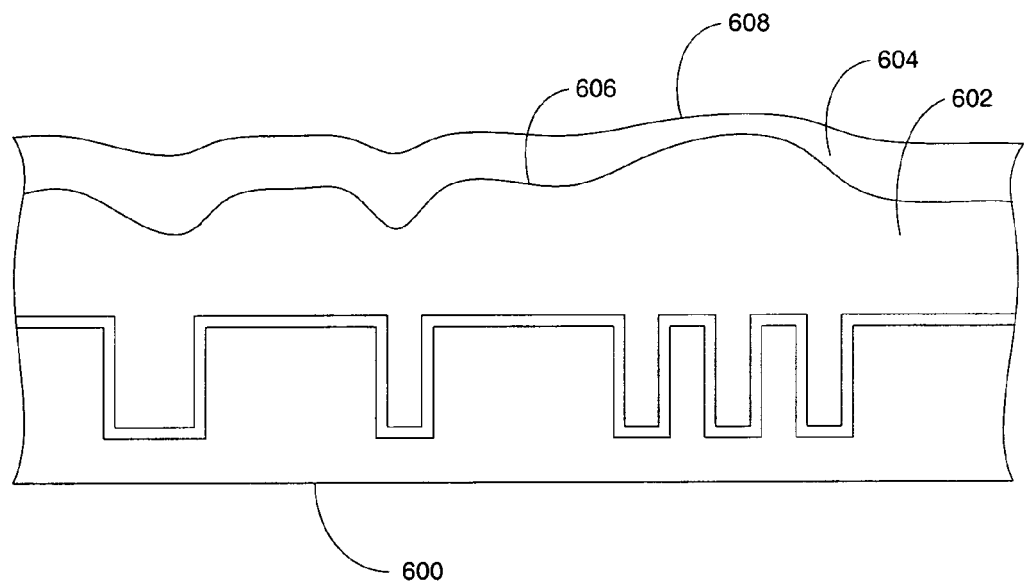
Figure 7:
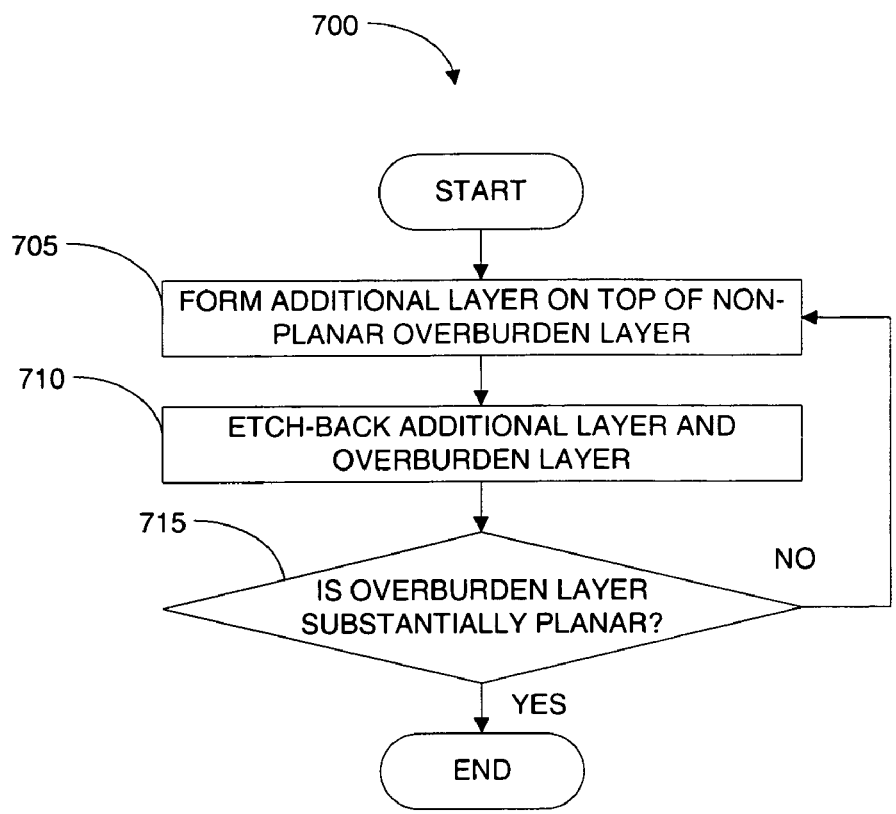
FIG. 7 is a flowchart of the method operations of the chemical conversion and etch-back processes applied to a substrate to increase local uniformity, in accordance with one embodiment of the present invention.

Referring now to FIGS. 6B and 7, in operation 705, an additional layer 604 is formed on top of the overburden portion 602. The additional layer 604 may be deposited or formed on the overburden portion 602. By way of example, the additional layer 604 can be formed through a chemical conversion of a top-most portion of the overburden portion 602. If the overburden portion 602 is copper or copper alloy, then a controlled exposure to a gas can form a copper reaction product layer 604. One example is a halogen gas that can form a Cu-halide layer 604. The copper reactant layer 604 diffuses into the surface of the copper overburden 602 to convert a top portion of the copper overburden 602. Processes for chemical conversion of copper are known in the art, such as Nagraj S. Kulkarni and Robert T. DeHoff, "Application of Volatility Diagrams for Low Temperature, Dry Etching, and Planarization of Copper", Journal of Electrochemical Society, 149 (11) G620–G632, 2002.

In another example, the additional layer 604 can be deposited on the overburden portion 602. The deposited layer 604 can include a polymer layer or an oxide layer being deposited on the overburden portion 602.

Figure 6C:
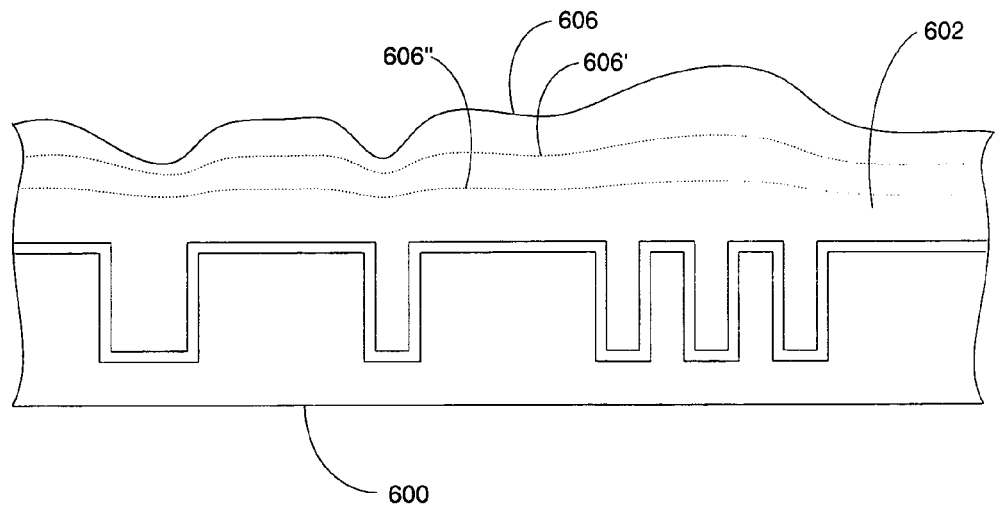
Figure 6D:
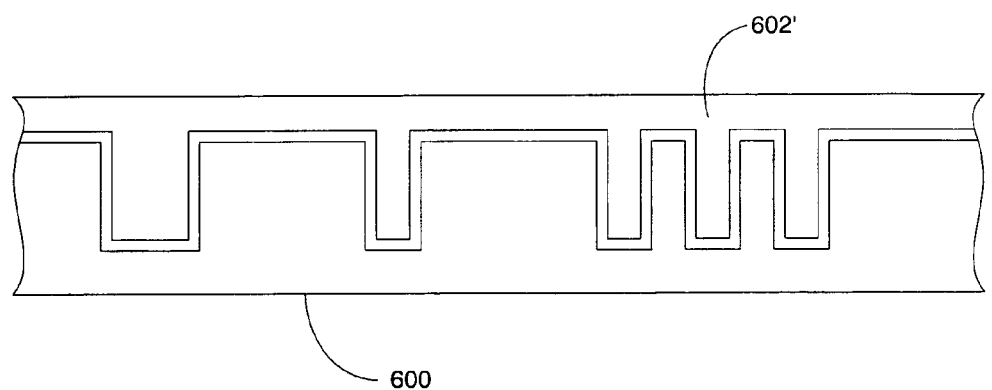

Referring now to operation 710 and FIG. 6C, an etch-back process is applied to remove the additional layer 604. A portion of the overburden portion 602 may also be removed. Removing the additional layer 604 results in further softening (i.e., planarizing) of the profile of the overburden portion 602 to profile 606'. The Cu-halide substantially softens the contours of the overburden portion 602. A Cu-halide can also maintain a substantially 1:1 etch-back selectivity with the copper overburden portion 602. Operations 705 and 710 can be repeated multiple times to substantially planarize the overburden portion 602 to subsequent profiles 606' and 606", as shown in FIG. 6D, until the resulting profile is substantially planar.

Chemical conversion of copper overburden portion 602 utilizing shape dependence of compound formation can be typically achieved by oxidizing the copper at the Cu-reactive species interface. Copper oxidization in this instance can include a chemical conversion of elemental copper to a copper compound with copper in a positive oxidation state. By way of example, oxidation of the copper to cuprous- or cupric chloride (CuCl or CuCl2) at the surface can occur in a chlorine plasma at lower temperatures (e.g., <200 degrees C.).

The etch-back process involves reduction of this copper compound to another chemical compound capable of being volatile and thus leaving the surface of the remaining overburden 602' at the fixed substrate temperature. By way of example, there can be a reduction of the CuCl2 to volatile Cu3Cl3 in the presence of reactive hydrogen species (e.g., H2 plasma). Alternating the shape-dependent conversion followed by etch-back of the converted portion can lead to bulk removal of the copper overburden portion 602, while simultaneously planarizing the topography (e.g., profile) of the copper overburden 602.

In operation 715, if the overburden portion 602 is substantially planarized, then the method operations end. Alternatively, if in operation 715, the overburden portion 602 is not substantially planarized, then the method operations continue at operation 705 above. In one embodiment, operations 705–715 can occur in situ within a single etch chamber.

In an alternative embodiment, operation 710 can occur ex situ and can include ECD or low-down force CMP processes to achieve the substantially planar overburden portion 602' as shown in FIG. 6D.

The method operations described in FIGS. 6A–7 can be used as a planar bulk removal process that performs both planarization of the non-planar overburden portion 602 and removal of the bulk of the overburden portion 602.

The local planarization of the substrates 200, 600 can be determined through any one or more of several known layer thickness mapping technologies that are known in the art. By way of example, an eddy current sensor can map the thickness of the overburden portion 212, 212' as described in commonly owned U.S. patent application Ser. No. 10/328,912 entitled System, Method And Apparatus For Thin-Film Substrate Signal Separation Using Eddy Current by Gotkis et al., filed on Dec. 23, 2002 and U.S. patent application Ser. No. 10/251,033 entitled System And Method For Metal Residue Detection And Mapping Within A Multi-Step Sequence by Gotkis et al., filed on Sep. 19, 2002, which are incorporated by reference herein, in their entirety.

The methods and systems described in FIGS. 1–7 above describe various approaches to substantially eliminating local, pattern dependant non-uniformities in an overburden portion. However, methods and systems described in FIGS. 1–7 above do not directly address correction of global non-uniformities. Global non-uniformities can include variations in removal rates of material in the center of the substrate as compared to the edge of the substrate and other non-uniformities that are not localized phenomena.

Figure 8:
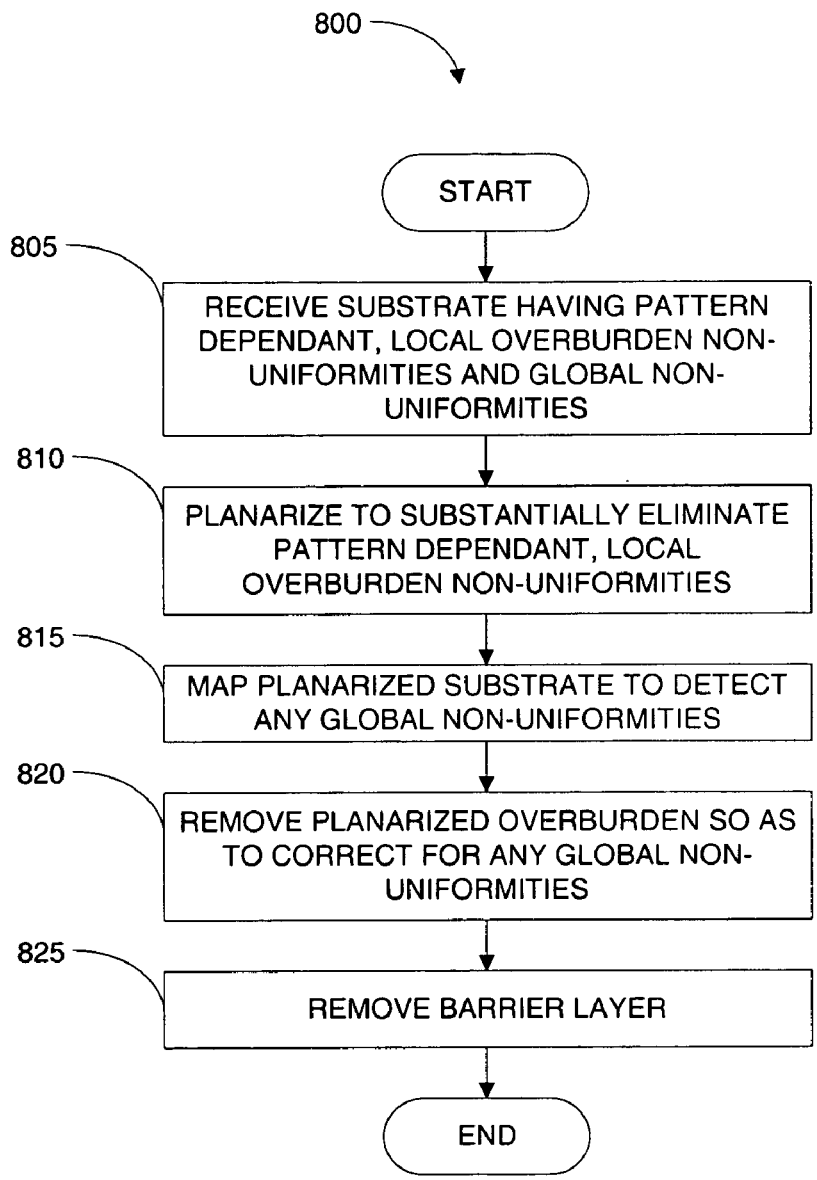
FIG. 8 is a flowchart of the method operation of correcting global non-uniformities in accordance with one embodiment of the present invention.

FIG. 8 is a flowchart of the method operation 800 of correcting global non-uniformities in accordance with one embodiment of the present invention. In operation 805, a substrate having localized non-uniformities such as feature-pattern dependant non-uniformities in the overburden portion is received. In operation 810, the localized non-uniformities are substantially eliminated such as through CMP, ECP or the methods and systems described in FIGS. 1–7 above or any other method known in the art. Substantially removing the localized non-uniformities forms a substantially, locally planarized overburden portion such as the planarized overburden portion 212' shown in FIG. 3 above.

Figure 9:
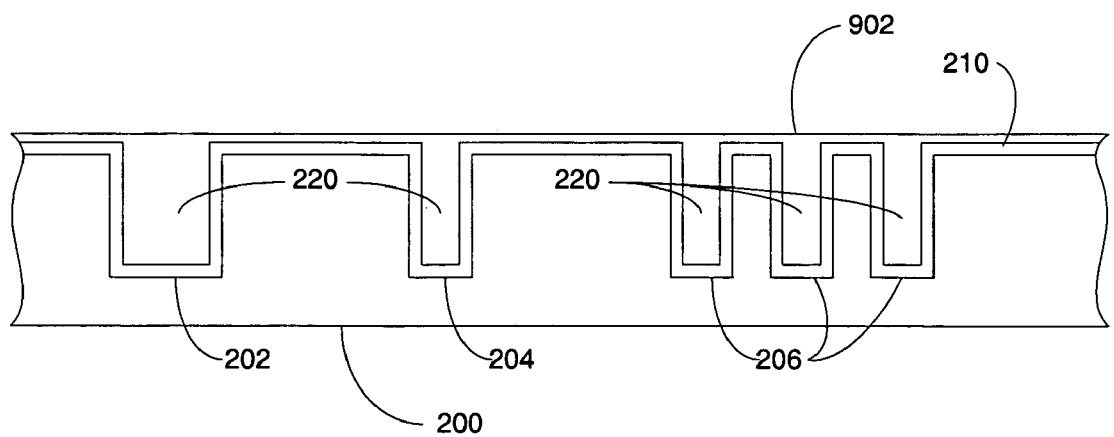
FIG. 9 shows a substantially removed, planarized overburden portion in accordance with one embodiment of the present invention.

FIG. 9 shows a substantially removed, planarized overburden portion 902 in accordance with one embodiment of the present invention. The substantially removed, planarized overburden portion 902 can be a relatively thin overburden portion such as a few hundred angstroms in thickness.

In operation 815, the substrate with the planarized overburden portion is mapped to identify and quantify any global non-uniformities in the planarized overburden portion. The planarized overburden portion can be mapped with any one or more of several known layer thickness mapping technologies that are known in the art as described above. The mapping can be in situ (within the current process chamber) or ex situ (external to the current process chamber). An in situ mapping process can also be dynamic and allow for the subsequent processes to be dynamically adjusted as the subsequent processes progress.

In operation 820, the location and quantity of the global non-uniformities, as determined in operation 815 above, are removed in a substantially mechanical stress-free process by adjusting an etching process to address the specific requirements of the detected global non-uniformities in a finish etch process. By way of example, if the remaining overburden portion 902 were approximately 500 angstroms thick in the center and 300 angstroms thick on the edge, then the recipe can be adjusted such that the center to edge non-uniformity can be compensated for so that the entire barrier layer 210 will be exposed simultaneously. The stress-free process avoids the CMP problems described above because no mechanical force is applied to the substrate during the etch-back process.

The recipe (e.g., selected values of process variables) that is selected is selective to barrier layer 210 (i.e., will etch the barrier at a much slower rate than the recipe will etch the copper, e.g., a typical selectivity range of copper etch over barrier etch in these processes is greater than about 1 but less than about 3) and that will minimize any recesses (e.g., excess removal of the conductive material 120 in the features 202, 204, 206).

The finish etch can have relatively slow etch rates for both copper of the remaining overburden portion 902 and the barrier layer 210 to minimize any recess into the features 202, 204, 206 with respect to the remaining height barrier of the barrier layer 210. As a result, the finish etch cannot have a very high selectivity to etch the copper.

A final etch-back process can also be included. The final etch-back process includes etch-back of the mask material and/or the ILD material with appropriate selectivity and uniformity control such that the final outcome provides substantially globally uniform and substantially planar features with minimal copper and ILD loss (e.g., any copper recess is globally uniform across the substrate 200 at the end of the final etch and barrier removal processes). In this instance, the final etch would include a uniform process to etch-back the mask material with high selectivity to minimize copper loss and minimize the copper recess. By way of example, a halogen-based process where the halogen concentration is low and the substrate temperature is low (e.g., less than about 200 degrees C.) will maintain a low copper etch rate while still sufficiently chemically etching the mask material. Any plasma feed gas including halogen reactive species (e.g., CF4, C2F6, C4F6) can be used. Etch rate control additives can include Ar, O2, CH2F2 and others can also be included.

If the global copper recess and/or mask/ILD loss are non-uniform across the substrate at the end of the finish etch and final etch-back process, then additional variations in the recipe must be taken to correct for the global non-uniformities. By way of example, typical instances are a result of etch non-uniformity are described as center fast or edge fast etch rates. In either of these instances, can result in a variation in copper recess and/or mask/ILD loss across the substrate. Compensation can be achieved to counter this variation to obtain globally planar features with minimal copper and mask loss utilizing appropriate uniformity and selectivity controls during the final etch-back of the mask/ILD material. In the instance of a center-fast finish etch process resulting in larger copper recess in the center of the substrate can be compensated for by an edge-fast final etch back process which selectively etches the mask material to bring to the same level as the copper level in the features 202, 204, 206. Typical selectivity obtained in this process is greater than about 2. Variations of the recipe to provide for uniformity control include pressure, temperature variation across substrate, ion flux uniformity controls, gas concentrations and chamber wall temperature. Variations to control selectivity include reactive halogen species concentration, substrate temperature, and bias power.

Pat II: Uneven Etch

Figure 10:
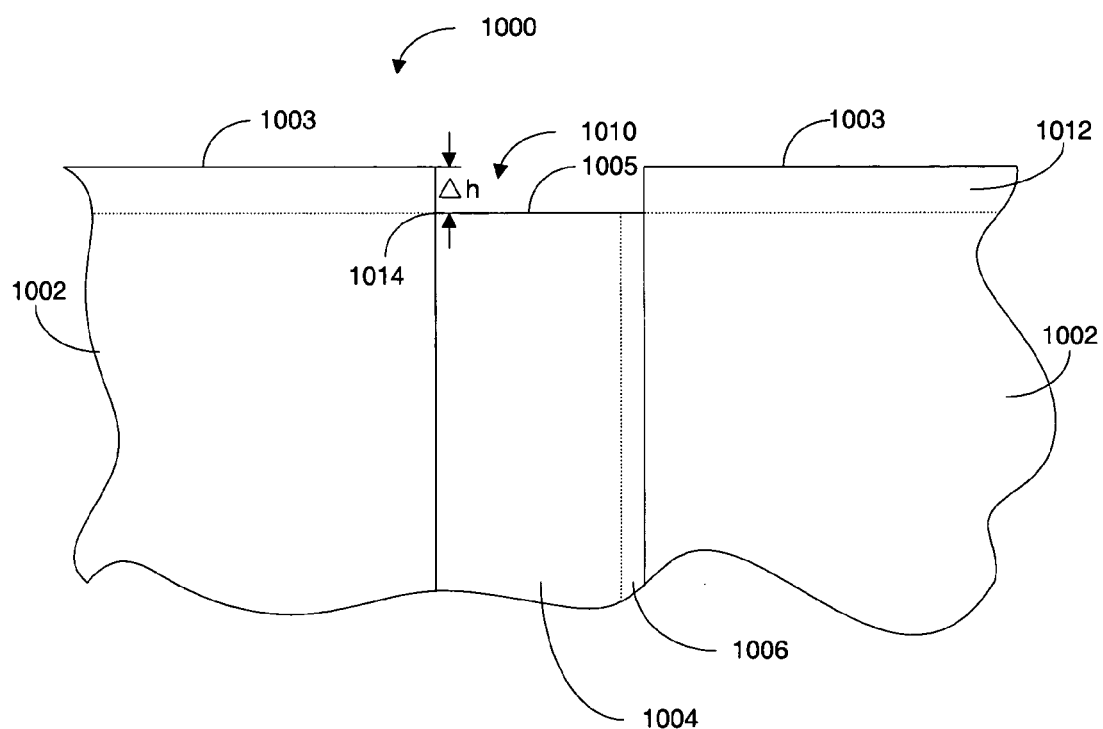
FIG. 10 shows a detailed view of a region of a top layer of a substrate, in accordance with one embodiment of the present invention.

Often the above-described stress free local and global planarization processes can cause a slightly uneven etch. This slightly uneven etch is most readily apparent where two different materials meet in the top layer of the substrate. FIG. 10 shows a detailed view of a region of a top layer 1000 of a substrate, in accordance with one embodiment of the present invention. The top layer 1000 includes a first material layer 1002 and a structure 1010 (e.g., a via, interconnect structure, etc.) formed from a second material 1004. The first material 1002 can be an oxide or a mask layer and can include multiple layers. The second material 1004 can be a conductive material (e.g., copper, aluminum, nickel, iron, titanium, tantalum, etc., and combinations thereof). The conductive material 1004 forms an interconnect through the first material layer 1002 to a device structure formed in an underlying layer (not shown). The structure 1010 can also include one or more liner-type materials 1006 that are well known in the art.

The first material layer 1002 and the conductive material 1004 meet at location 1014. Due to various process variables such as even very slightly different etch rates between the first material layer 1002 and the conductive material 1004, a very slight dishing of the conductive material can occur. The dishing has a dishing depth ($\Delta h$) range of between about 0 and 500 angstroms ($\Delta h$ is not drawn to scale).

An endpoint etch can be used to selectively etch the first material layer 1002 without etching the conductive material 1004 or the liner material 1006. As a result, the endpoint etch can significantly eliminate the dishing such that the dishing depth $\Delta h$ approaches zero. The endpoint etch is described in more detail in co-pending and commonly owned U.S. patent application Ser. No. 10/769,522, filed on Jan. 30, 2004 and entitled "System and Method for Stress Free Conductor Removal," which is incorporated herein by reference in its entirety.

Part III: Cleaning

Figure 11A:
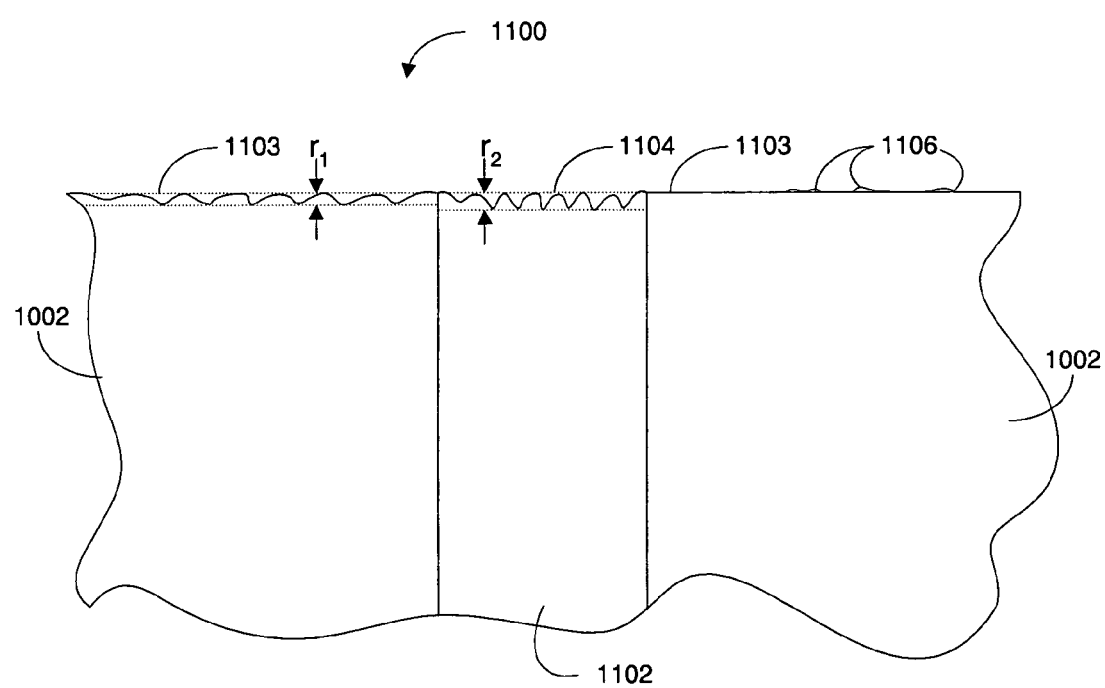
FIG. 11A shows a detailed view of a stress-free planarized substrate, in accordance with one embodiment of the present invention.

As described above, the foregoing stress free local and global planarization methods can be used to planarize a copper overburden layer. However, often the resulting exposed, planar layer can have a relatively rough surface. FIG. 11A shows a detailed view of a stress-free planarized substrate 1100, in accordance with one embodiment of the present invention. The stress-free planarized substrate 1100 includes a copper device 1102 formed in the first material layer 1002. The exposed surface 1103 of the first material layer 1002 and the exposed surface 1104 copper device 1102 can be relatively rough. The roughness of the exposed surface 1103 is expressed as a roughness value "r1". The roughness of the copper surface 1104 is expressed as a roughness value "r2." The roughness values r1 and r2, are an average peak-to-peak dimension of the respective surfaces 1103 and 1104.

If the copper device 1102 and the first material layer 1002 have a substantially 1:1 etch selectivity, then r1 and r2 are substantially equal. By way of example r1 and r2 can have a value of less than about 100 nm. Alternatively, if the etch is selective to the first material layer 1002, then r1 can be less than or equal to r2. By way of example r1 can have a value of less than about 35 nm and r2 can have a value of less than about 100 nm. Conversely, if the etch is selective to the copper device 1102, then r1 can be greater than or equal to r2. By way of example r2 can have a value of less than about 35 nm and r1 can have a value of less than about 100 nm. The surface roughness is believed to be caused by the aggressive chemical reactions that occur during the etching processes.

A certain amount of surface roughness can be tolerated (e.g., r1 and r2 less than or equal to about 20 angstrom). However, if either of r1 or r2 exceeds about 20 angstrom, then a subsequent layer of material may not be able to properly adhere to the surfaces 1103, 1104. By way of example, a void may occur between the surface 1104 and the subsequent layer of material (not shown) that may be formed on the surface 1104. Such a void reduces the contact area between the copper device 1102 and the subsequent layer of material. The reduced contact area decreases the efficiency of the contact by, for example, causing increased resistance. Such voids can also promote corrosion that can further degrade the contact. As will be described in more detail below, a cleaning process can be applied to the surface 1104 to reduce the roughness.

An etch residue 1106 can also remain on the surface 1103 of the substrate and on the surface 1104 of the copper device 1102, after the local and global planarization processes described above. The etch residue 1106 can include a metallic residue (e.g., Ni, Cu, Al, Fe, Ti, Ta, etc.) on the surfaces 1103 and 1104. Alternatively or additionally, the etch residue 1106 can include unacceptable amounts of the etch chemistries (e.g., $Cl_2$, F, Br, I, $C_xH_yF_z$, etc.) that may have remained on the surfaces 1103 and 1104. A cleaning process can be applied to substantially remove the etch residue 1106.

Figure 11B:
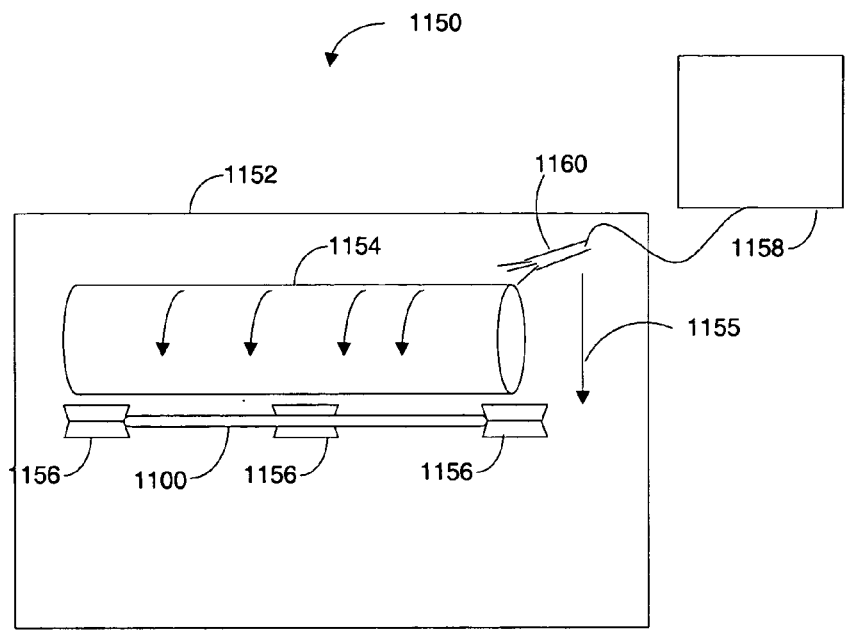
FIG. 11B shows one example a rinsing system, in accordance with one embodiment of the present invention.

The cleaning process can be applied to the surfaces 1103 and 1104 by any of several means. FIG. 11B shows one example a rinsing system 1150, in accordance with one embodiment of the present invention. The rinsing system includes a brush box 1152. The semiconductor substrate 1100 can be input to the brush box 1152. The brush box 1152 includes a cleaning brush 1154 and supporting devices 1156 (e.g., edge rollers or other type of supports). The supporting devices 1156 support, and in certain embodiments can also rotate the semiconductor substrate 1100. A rinsing fluid (e.g., DI water) or cleaning chemistry 1158 (e.g., Ontrak Clean 2500 series from Air Products and Chemicals of Allentown, Pa., or ESC 700 series cleaning chemistries such as ESC 784 from ATMI also of Allentown, Pa.) can be applied to the semiconductor substrate 1100 through the brush 1154 and/or a nozzle 1160. By way of example, ESC 784 could be used to remove a copper-containing residue from an oxide layer on the surface of the substrate. The brush 1154 can be moved relative to the semiconductor substrate 1100. By way of example, the brush 1154 can be rotated, moved toward and away from, and laterally across the surface of the semiconductor substrate 1100. The brush 1154 can also be applied at a force 1154 into the surface of the semiconductor substrate 1100. The brush 1154 and/or the rinsing fluid or cleaning chemistry 1158 will remove the etch residue 1106.

The cleaning chemistry 1158 can be selective to the surface 1103 of the first material layer 1002 that bounds the copper device 1102. As the cleaning chemistry 1158 is selective to the surface 1103 of the first material layer 1002, the cleaning chemistry 1158 can also be selected so as to remove a portion of the rough surface 1104 of the copper device 1102.

Referring again to FIG. 10 above, in an alternative embodiment, the cleaning chemistry 1158 can be selective to the surface 1005 of the device 1004. The cleaning process can therefore substantially remove a top portion 1012 of the substrate 1002 until the Δh approaches zero.

The cleaning process also imparts a minimal shearing force to the surfaces 1003, 1103 and 1104 because very little physical force is actually applied to the semiconductor substrate 1100. The minimal shearing force substantially minimizes any stress related failures that may be caused by prior art non-stress free processes (e.g., a typical CMP process).

Figure 11C:
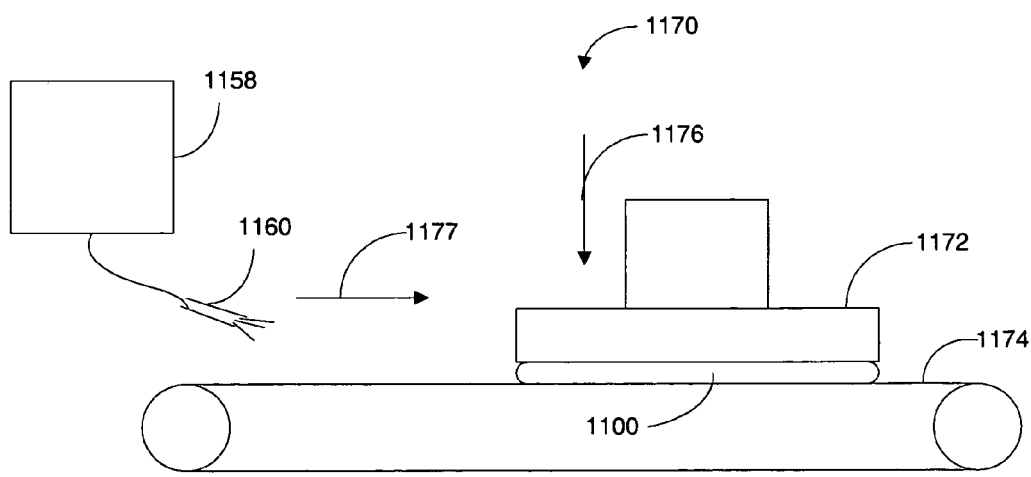
FIG. 11C shows a simplified diagram of a low down force CMP system, in accordance with one embodiment of the present invention.

In one embodiment, the cleaning process can be applied in a low down force CMP process. FIG. 11C shows a simplified diagram of a low down force CMP system 1170, in accordance with one embodiment of the present invention. The low down force CMP system 1170 includes a polishing head 1172 for supporting the semiconductor substrate 1100. The polishing head 1172 holds the semiconductor substrate 1100 on a polishing pad 1174. The polishing pad 1174 is movable (e.g., in direction 1177) relative to the surface semiconductor substrate 1100. By way of example, the polishing pad 1174 can be a belt-type polishing pad, as shown, that can be transported past the semiconductor substrate 1100 by the rollers 1175. Alternatively, the polishing pad 1174 can be mounted on a circular or rotary table as are well known in the art. Alternatively or in addition to, the polishing head 1172 can also move (e.g., rotate, oscillate, move from side to side, etc.) the semiconductor substrate 1100 relative to the polishing pad 1174.

The low down force CMP system 1170 has a maximum down force 1176 applied to the semiconductor substrate 1100 of less than about 1 psi. Since the surface of the semiconductor substrate 1100 is substantially planar, both globally and locally, then, unlike in typical CMP processes, any stresses that may be imparted to the surfaces are not localized or otherwise concentrated such as described in FIGS. 1A–1C above. Further, the low down force (i.e., less than about 1 psi) substantially reduces any stresses that might be imparted to the surfaces being cleaned. Also, due at least in part to the less than about 1 psi down force, the material removal rate is considerably slower than in a typical, prior art CMP processes. Due to the combination of the low down force (e.g., less than 1 psi) and lack of concentration of any stresses, then any stresses imparted to the surface being cleaned can safely be maintained at a level substantially less than a fracture strength between interfaces of materials. By way of example, the stresses are substantially an adhesion strength between two materials.

It should be understood that the term "down" in the phrase "down force" is not intended to be direction specific but rather is intended to describe that the force 1176 is applied in a direction perpendicular to the surface of the semiconductor substrate 1100. By way of example, if the polishing pad 1174 and polishing head 1172 were in a vertical configuration, rather than the horizontal configuration as shown, then the down force 1176 would be applied in a horizontal direction.

Part IV: Cleaning Using a Dynamic Liquid Meniscus

The cleaning process can also be applied by manipulating a liquid meniscus over the surfaces 1003, 1103 and 1104. A liquid meniscus can be manipulated with a proximity head such as described in co-pending and commonly owned U.S. patent application Ser. No. 10/769,498, filed on Jan. 30, 2004 and entitled "Stress Free Etch Processing in Combination with a Dynamic Liquid Meniscus," which is incorporated herein by reference in its entirety. A dynamic liquid meniscus process allows very small portions of the surface area of the substrate to be processed. Thereby allowing very precise control of the forces applied therein.

Figure 12A:
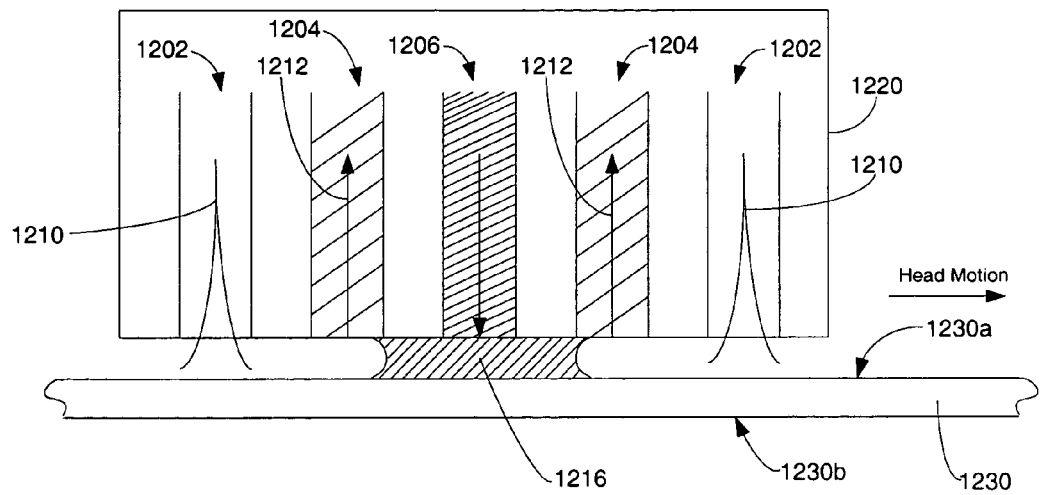
FIG. 12A illustrates a proximity head performing an exemplary substrate processing operation in accordance with one embodiment of the present invention.

FIG. 12A illustrates a proximity head 1220 performing an exemplary substrate processing operation in accordance with one embodiment of the present invention. The proximity head 1220, in one embodiment, moves while in close proximity to the top surface 1230a of the substrate 1230 to conduct a cleaning, polishing or other processing operation. It should be appreciated that the proximity head 1230 may also be utilized to process (e.g., clean, polish, etc.) the bottom surface 1230b of the substrate 1230. In one embodiment, the substrate 1230 is rotating so the proximity head 1220 may be moved in a linear fashion along the head motion while fluid is removed from the top surface 1230a. By applying the IPA 1210 through the source inlet 1202, the vacuum 1212 through source outlet 1204, and the deionized water 1214 through the source inlet 1206, the meniscus 1216 can be generated.

Figure 12B:
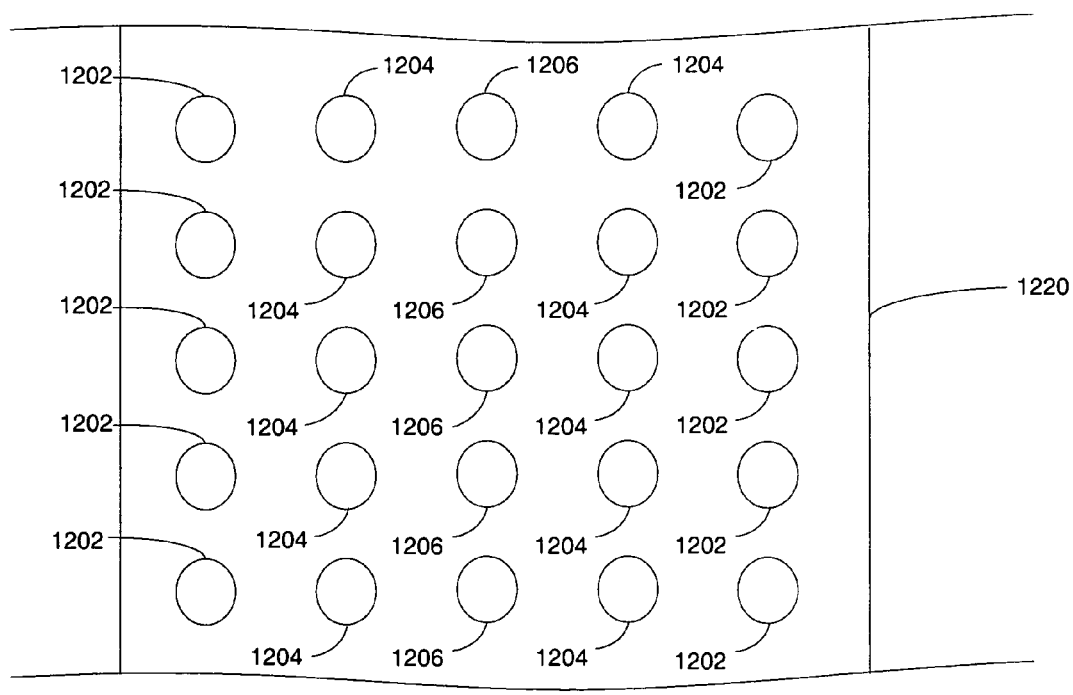
FIG. 12B shows a top view of a portion of a proximity head in accordance with one embodiment of the present invention.

FIG. 12B shows a top view of a portion of a proximity head 1220 in accordance with one embodiment of the present invention. In the top view of one embodiment, from left to right are a set of the source inlet 1202, a set of the source outlet 1204, a set of the source inlet 1206, a set of the source outlet 1204, and a set of the source inlet 1202. Therefore, as $N_2$/IPA and DIW are inputted into the region between the proximity head 1220 and the wafer 1230, the vacuum removes the $N_2$/IPA and the DIW along with any fluid film that may reside on the wafer 1230. The source inlets 1202, the source inlets 1206, and the source outlets 1204 described herein may also be any suitable type of geometry such as for example, circular opening, square opening, etc. In one embodiment, the source inlets 1202 and 1206 and the source outlets 1204 have circular openings.

Figure 13A:
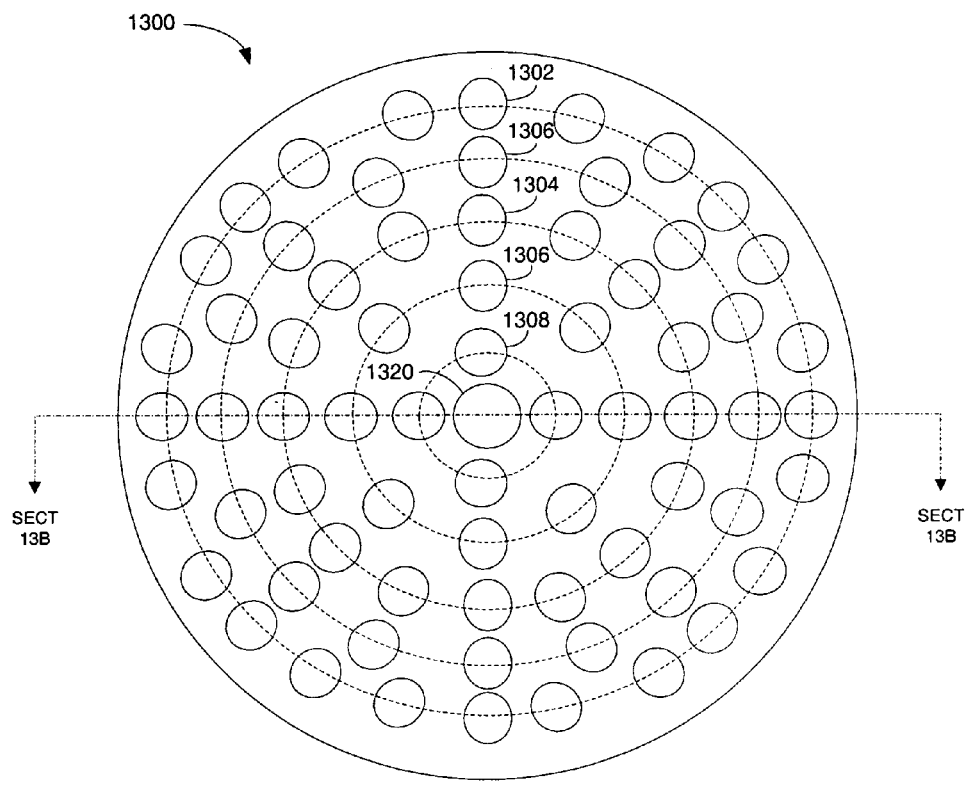
FIG. 13A illustrates an exemplary proximity head, in accordance with one embodiment of the present invention.
Figure 13B:
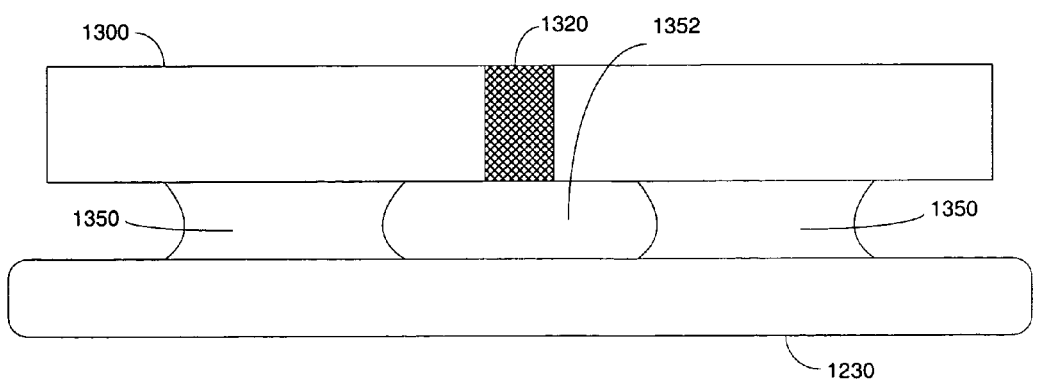
FIG. 13B illustrates a sectional view of the proximity head and the meniscus formed by the proximity head, in accordance with one embodiment of the present invention.

FIG. 13A illustrates an exemplary proximity head 1300, in accordance with one embodiment of the present invention. FIG. 13B illustrates a sectional view of the proximity head 1300 and the meniscus 1350 formed by the proximity head 1300, in accordance with one embodiment of the present invention. The proximity head 1300 includes a ring of multiple process chemistry inlets 1304, two rings of multiple IPA inlets 1302 and 1308 and a ring of multiple vacuum outlets 1306. The various inlets 1302, 1304, 1306 and outlets 1308 are arranged around a sensor 1320. The sensor 1320 is a metrology sensor that can evaluate the progress of the fabrication process being applied by the processing head 1300. The sensor can be an optical endpoint detection sensor so as to enable the above-described endpoint detection systems and methods to be used.

The meniscus 1350 can include a "dry" central region 1352 where the liquid meniscus is removed so that the sensor 1320 has no intervening processing chemistry from the meniscus 1350 between the sensor and the surface of the wafer 1230. Rotating the wafer 1230 and scanning the proximity head 1300, and therefore the sensor 1320, across the wafer 1230 can provide an in-situ scan of the entire surface of the wafer, as the proximity head processes the wafer. The sensor 1320 can also provide real time feedback of the etch process. Providing the real time feedback to a control system that controls the process will provide a closed control loop of the process. The closed loop control of the process can allow the control system to interactively adjust the process in real time. Any of the multiple process variables can be adjusted including head position, concentrations, temperature, resident time, flow rates, pressures, chemistry and other process variables. In this manner more precise process control is provided. A more precise process control allows ever more concentrated chemistries to be used, which in turn reduces the process time of the wafer to a minimum.

The in-situ, real time control of the process can also enable a variable process to be applied to the surface of the wafer such as to correct for a non-uniformity during the processing of the wafer. By way of example, if in a buffing or cleaning process, the sensor can detect a first roughness in a first region of the substrate 1230. The process recipe can be dynamically adjusted (e.g., chemistry concentration, residence time, temperature, etc.) for the detected roughness as the proximity head 1300 moves across the substrate 1230. As a result, a non-uniform surface roughness can be dynamically corrected, in-situ as the cleaning or buffing process is applied to the substrate 1230.

In an alternative embodiment, the dry region 1352 is not required. By way of example, if the sensor 1320 can measure surface roughness through a layer of liquid (e.g., the meniscus 1350) such as the process chemistry being applied to the surface of the substrate 1230.

Figure 14:
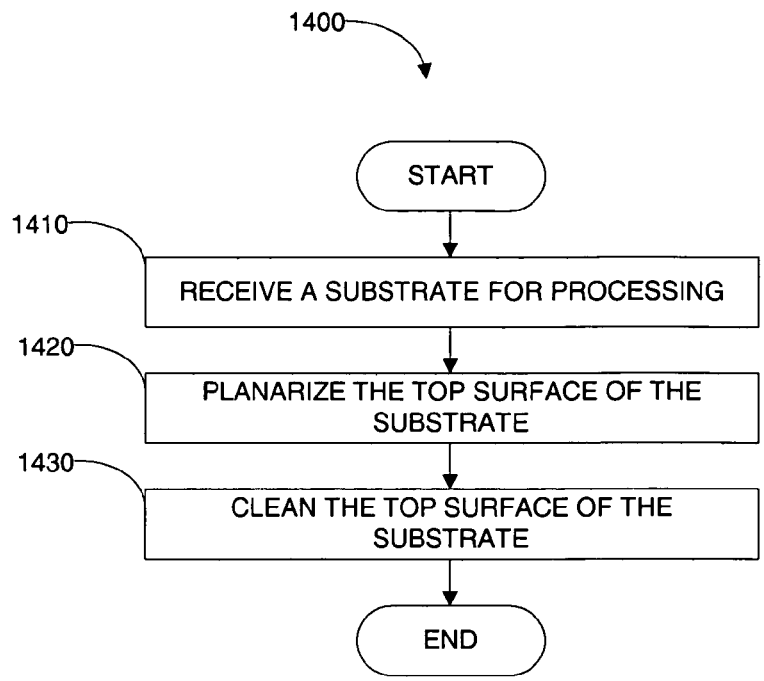
FIG. 14 is a flowchart diagram that illustrates the method operations performed in a stress-free processing a substrate, in accordance with one embodiment of the present invention.

FIG. 14 is a flowchart diagram that illustrates the method operations 1400 performed in a stress-free processing a substrate, in accordance with one embodiment of the present invention. In an operation 1410 a substrate is received for processing.

In an operation 1420, the top surface of the substrate is planarized. The planarized top surface is substantially free of device dependent planarity nonuniformities and device independent planarity nonuniformities. The substrate can be planarized in a stress-free planarization process such as described in FIGS. 2A–9 above. Alternatively, the substrate can be planarized in any suitable process than can successfully planarize the top surface to be substantially free of device dependent planarity nonuniformities and device independent planarity nonuniformities without imparting excess stresses to the substrate.

The top surface also includes a first material (e.g., oxide) and a device structure (e.g., interconnect, trench, etc.) formed within the first material. The device structure is formed from a second material. The second material can be a conductive material (e.g., copper, aluminum, tantalum, titanium, and combinations thereof, etc.). The second material can also be a non-conductive material. A surface of the device is exposed. The surface of the device has a first surface roughness. The first roughness having an average roughness value of greater than about 40 angstrom.

In an operation 1430, a cleaning process is applied to the top surface to substantially reduce the first roughness to less than about 40 angstrom. The cleaning process can be at least one or more of: a low down force CMP process, a dynamic liquid meniscus process, an endpoint etch process, or a rinsing and cleaning process. the method operations can then end.

Figure 15:
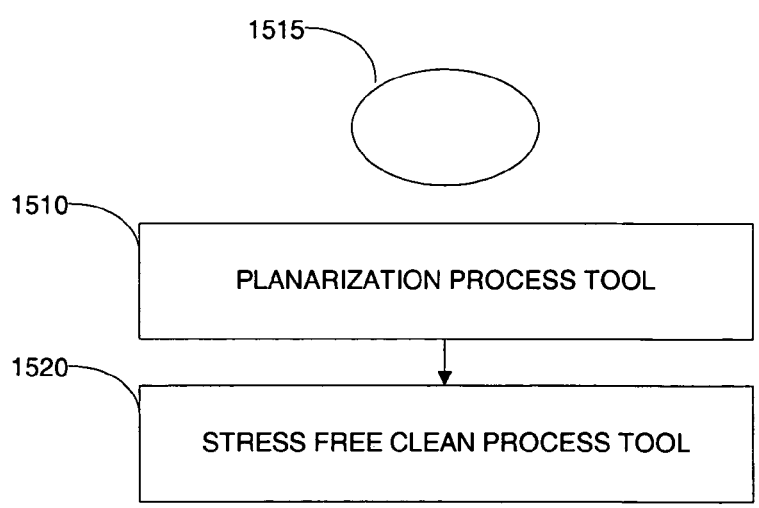
FIG. 15 is a block diagram of a substrate processing system, in accordance with one embodiment of the present invention.

FIG. 15 is a block diagram of a substrate processing system 1500, in accordance with one embodiment of the present invention. The substrate processing system 1500 includes a planarization process tool 1510 and a stress free cleaning process tool 1520. As described above, the planarization process tool 1510 can be any type of planarization process tool that can planarize a substrate 1515 to substantially eliminate any device dependant and device independent non-uniformities. In at least one embodiment, the planarization process tool 1510 can perform the planarization processes described in FIGS. 2A–9 above.

The stress free cleaning process tool 1520 can be any one or more of an endpoint etch process tool, a dynamic liquid meniscus process tool, a brush box, and a low down force CMP process tool.

As used herein in connection with the description of the invention, the term "about" means +/−10%. By way of example, the phrase "about 250 degrees C." indicates a range of between 225 degrees C. and 275 degrees C. It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or a hard disk drive of a computer or microprocessor control system (e.g., a process control system).

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of cleaning a substrate comprising:
   receiving a substrate having a top surface;
   planarizing the substrate to substantially eliminate any device dependent planarity nonuniformities and any device independent planarity nonuniformities including applying a planarizing process that does not impart stresses to the substrate that would cause stress-related failures in a device or structure formed in the substrate;
   wherein the top surface of the substrate being substantially free of device dependent planarity nonuniformities and device independent planarity nonuniformities, the top surface including:
      a first material; and
      a device structure formed in the first material, the device structure having a device surface exposed, the device surface having a first surface roughness, the device structure being formed from a second material; and
   applying a cleaning process to the top surface.

2. The method of claim 1, wherein the device structure is formed in a damascene process.

3. The method of claim 1, wherein the top surface being substantially free of device dependent planarity nonuniformities and device independent planarity nonuniformities includes the top surface being substantially locally planar and substantially globally planar.

4. The method of claim 1, wherein the cleaning process substantially reduces the first surface roughness to less than about 20 angstrom.

5. The method of claim 1, wherein the cleaning process includes a dynamic liquid meniscus process.

6. The method of claim 1, wherein the cleaning process includes a low down force CMP process.

7. The method of claim 6, wherein the low down force CMP process includes applying less than about 1 psi down force.

8. The method of claim 1, wherein the cleaning process includes an endpoint etch process.

9. The method of claim 1, wherein the cleaning process includes applying a brush to the surface of the substrate.

10. The method of claim 9, wherein the cleaning process further includes applying a wet etch chemistry to the surface of the substrate.

11. The method of claim 9, wherein the cleaning process further includes applying a cleaning process using a dynamic liquid meniscus.

12. The method of claim 1, wherein the cleaning process imparts a minimal shearing force.

13. The method of claim 1, wherein the cleaning process is selective to the first material.

14. The method of claim 1, wherein the cleaning process is selective to the second material.

15. A method of processing a substrate comprising:
   receiving a substrate; and
   planarizing a top surface of the substrate to substantially eliminate any device dependent planarity nonuniformities and any device independent planarity nonuniformities, including applying a planarizing process that does not impart stresses to the substrate that would cause stress-related failures in a device or structure formed in the substrate, the top surface including:
      a first material; and
      a device structure formed in the first material, the device structure having a device surface exposed, the device surface having a first surface roughness, the device structure being formed from a second material; and
   applying a cleaning process to the top surface.

16. A method of processing a substrate comprising:
   receiving a substrate;
   planarizing a top surface of the substrate to substantially eliminate any device dependent planarity nonuniformities and any device independent planarity nonuniformities, wherein planarizing the substrate to substantially eliminate any device dependent planarity nonuniformities and any device independent planarity nonuniformities includes applying a substantially stress-free etch planarization process, the top surface including:
      a first material; and
      a device structure formed in the first material, the device structure having a device surface exposed, the device surface having a first surface roughness, the device structure being formed from a second material; and
   applying a cleaning process to the top surface.

* * * * *